United States Patent
Kim et al.

(10) Patent No.: US 8,791,460 B2
(45) Date of Patent: Jul. 29, 2014

(54) THIN FILM TRANSISTOR SUBSTRATE INCLUDING A FLUORINE LAYER IN AN ACTIVE PATTERN

(71) Applicant: Samsung Display Co., Ltd., Yongin (KR)

(72) Inventors: Dae-Ho Kim, Daegu (KR); Hyun-Jae Na, Seoul (KR); Yong-Su Lee, Hwaseong-si (KR); Myoung-Geun Cha, Seoul (KR); Yoon-Ho Khang, Yongin-si (KR); Sang-Gab Kim, Seoul (KR); Jae-Neung Kim, Seongnam-si (KR); Se-Hwan Yu, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/693,423

(22) Filed: Dec. 4, 2012

(65) Prior Publication Data
US 2014/0054579 A1 Feb. 27, 2014

(30) Foreign Application Priority Data
Aug. 22, 2012 (KR) .......................... 10-2012-0091815

(51) Int. Cl.
*H01L 29/10* (2006.01)
(52) U.S. Cl.
USPC ............................................. 257/66; 257/43

(58) Field of Classification Search
USPC .................... 257/43, 57, 66, 72, 88, E29.083, 257/E33.004, E27.06; 438/158
See application file for complete search history.

(56) References Cited

U.S. PATENT DOCUMENTS

2007/0194379 A1 * 8/2007 Hosono et al. ................ 257/347
2009/0108265 A1 * 4/2009 Choi et al. ....................... 257/66

FOREIGN PATENT DOCUMENTS

| JP | 07221312 A | 8/1995 |
|---|---|---|
| JP | 09092840 A | 4/1997 |
| KR | 0989200 B1 | 10/2010 |

* cited by examiner

*Primary Examiner* — Yu-Hsi D Sun
*Assistant Examiner* — Christina Sylvia
(74) *Attorney, Agent, or Firm* — Cantor Colburn LLP

(57) ABSTRACT

A thin film transistor substrate includes a base substrate, an active pattern, a gate insulation pattern and a gate electrode. The active pattern is disposed on the base substrate. The active pattern includes a source electrode, a drain electrode, and a channel disposed between the source electrode and the drain electrode. The gate insulation pattern and the gate electrode overlap with the channel. The gate insulation pattern is disposed between the channel and the gate electrode. The source electrode and the drain electrode each include a fluorine deposition layer.

10 Claims, 13 Drawing Sheets

THIN FILM TRANSISTOR SUBSTRATE INCLUDING A FLUORINE LAYER IN AN ACTIVE PATTERN

This application claims priority to Korean Patent Application No. 10-2012-0091815, filed on Aug. 22, 2012, and all the benefits accruing therefrom under 35 U.S.C. §119, the contents of which in its entirety is herein incorporated by reference.

BACKGROUND

1. Field

Exemplary embodiments of the invention relate to a thin film transistor substrate and a method of manufacturing the thin film transistor substrate. More particularly, exemplary embodiments of the invention relate to a thin film transistor substrate improving a decrease of specific resistance of a signal electrode according to plasma treatment, and a method of manufacturing the thin film transistor substrate.

2. Description of the Related Art

Generally, a display apparatus includes a switching element to apply a driving voltage to a pixel electrode. The switching element includes a gate electrode, a source electrode and a drain electrode. A channel layer forming a channel according to a gate voltage applied to the gate electrode is disposed between the source electrode and the drain electrode of the switching element. The channel layer includes a semiconductor layer including amorphous silicon, poly-silicon or an oxide semiconductor.

When the semiconductor layer includes amorphous indium-gallium-zinc oxide ("a-IGZO"), a portion of the a-IGZO treated by Argon (Ar) plasma is converted to a conductive member, which forms the source electrode and the drain electrode.

However, a specific resistance of the source electrode and the drain electrode does not sufficiently decrease below a certain level only by the Ar plasma treatment on the a-IGZO. Also, the specific resistance of the conductive electrode generated by the Ar plasma treatment is not uniform on a surface of the conductive electrode, such that it is difficult to apply the plasma treatment on a substrate having a relatively large area.

SUMMARY

One or more exemplary embodiment of the invention provides a thin film transistor ("TFT") substrate improving a reduction of specific resistance of a signal electrode according to plasma treatment, and increasing uniformity of specific resistance of the signal electrode.

One or more exemplary embodiment of the invention also provides a method of manufacturing the TFT substrate.

In an exemplary embodiment of a TFT substrate according to the invention, the TFT substrate includes a base substrate, an active pattern disposed on the base substrate and including a semiconductor material, and a source electrode, a drain electrode, and a channel disposed between the source electrode and the drain electrode, a gate insulation pattern overlapping the channel, and a gate electrode overlapping the channel. The gate insulation pattern is disposed between the channel and the gate electrode. The source electrode and the drain electrode including a fluorine deposition layer.

In an exemplary embodiment, the channel may include amorphous indium-gallium-zinc oxide.

In an exemplary embodiment, the source electrode, the drain electrode and the channel may be disposed in a single or same layer of the TFT substrate.

In an exemplary embodiment, the gate insulation pattern may be between the base substrate and the gate electrode.

In an exemplary embodiment, the gate electrode may be between the base substrate and the gate insulation pattern.

In an exemplary embodiment, a thickness of the fluorine deposition layer may be between about 1 nanometer and about 10 nanometers.

In an exemplary embodiment, treating exposed surfaces of the semiconductor material by fluorine plasma, respectively, may form the source electrode and the drain electrode including the fluorine deposition layer.

In an exemplary embodiment, the active pattern has a uniform specific resistance, and treating the source electrode and the drain electrode by helium plasma may form the uniform specific resistance of the active pattern.

In an exemplary embodiment, the source electrode and the drain electrode may further include a hydrogen doped layer.

In an exemplary embodiment, the fluorine deposition layer may be disposed closer to upper surfaces of the source electrode and the drain electrode than the hydrogen doped layer.

In an exemplary embodiment of a method of manufacturing a TFT substrate according to the invention, the method includes providing a semiconductor layer on a substrate, patterning the semiconductor layer to form a semiconductor pattern, providing a gate insulation layer and a gate metal layer sequentially on the semiconductor pattern, patterning the gate metal layer to form a gate electrode, patterning the gate insulation layer to form a gate insulation pattern, and treating the semiconductor layer by a first plasma using the gate electrode and the gate insulation pattern as a mask, to form a source electrode and a drain electrode. The source electrode and the drain electrode include a fluorine deposition layer.

In an exemplary embodiment, the first plasma may include fluorine plasma.

In an exemplary embodiment, the first plasma may include hydrogen plasma.

In an exemplary embodiment, the method may further include treating the source electrode and the drain electrode by helium plasma.

In the exemplary embodiment, the method may further include providing a passivation layer covering the source electrode, the drain electrode, and the gate electrode, providing an organic insulation layer on the passivation layer, providing a contact hole penetrating the passivation layer and the organic insulation layer, and providing a pixel electrode electrically connected to the drain electrode through the contact hole.

In another exemplary embodiment of a method of manufacturing a TFT substrate according to the invention, the method includes providing a gate electrode on the substrate, providing a gate insulation layer on the gate electrode, providing a semiconductor pattern on the gate insulation layer, providing a photoresist pattern on the semiconductor pattern, and treating the semiconductor pattern by a first plasma using the photoresist pattern as a mask, to form a source electrode and a drain electrode. The source electrode and the drain electrode include a fluorine deposition layer.

In an exemplary embodiment, the first plasma may include fluorine plasma.

In an exemplary embodiment, the first plasma may include hydrogen plasma.

In an exemplary embodiment, the method may further include treating the source electrode and the drain electrode by helium plasma.

In an exemplary embodiment, the method may further include providing a passivation layer covering the source electrode and the drain electrode, providing a data line on the passivation layer, providing an organic insulation layer covering the data line, providing a contact hole penetrating the passivation layer and the organic insulation layer, and providing a pixel electrode electrically connected to the drain electrode through the contact hole.

According to one or more exemplary embodiment of the TFT substrate and the method of manufacturing the TFT substrate, a signal electrode includes a fluorine deposition layer, a hydrogen doped layer or both a fluorine deposition layer and a hydrogen doped layer formed by a first plasma treatment of a semiconductor material using fluorine plasma, hydrogen plasma or helium plasma so that an electron carrier concentration of the signal electrode increases, to reduce a specific resistance of the signal electrode.

In addition, a portion of the signal electrode already treated by the first plasma is further treated by helium plasma as a second plasma so that uniformity of the specific resistance of the conductive signal electrode increases when the semiconductor material is converted to the conductive signal electrode.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
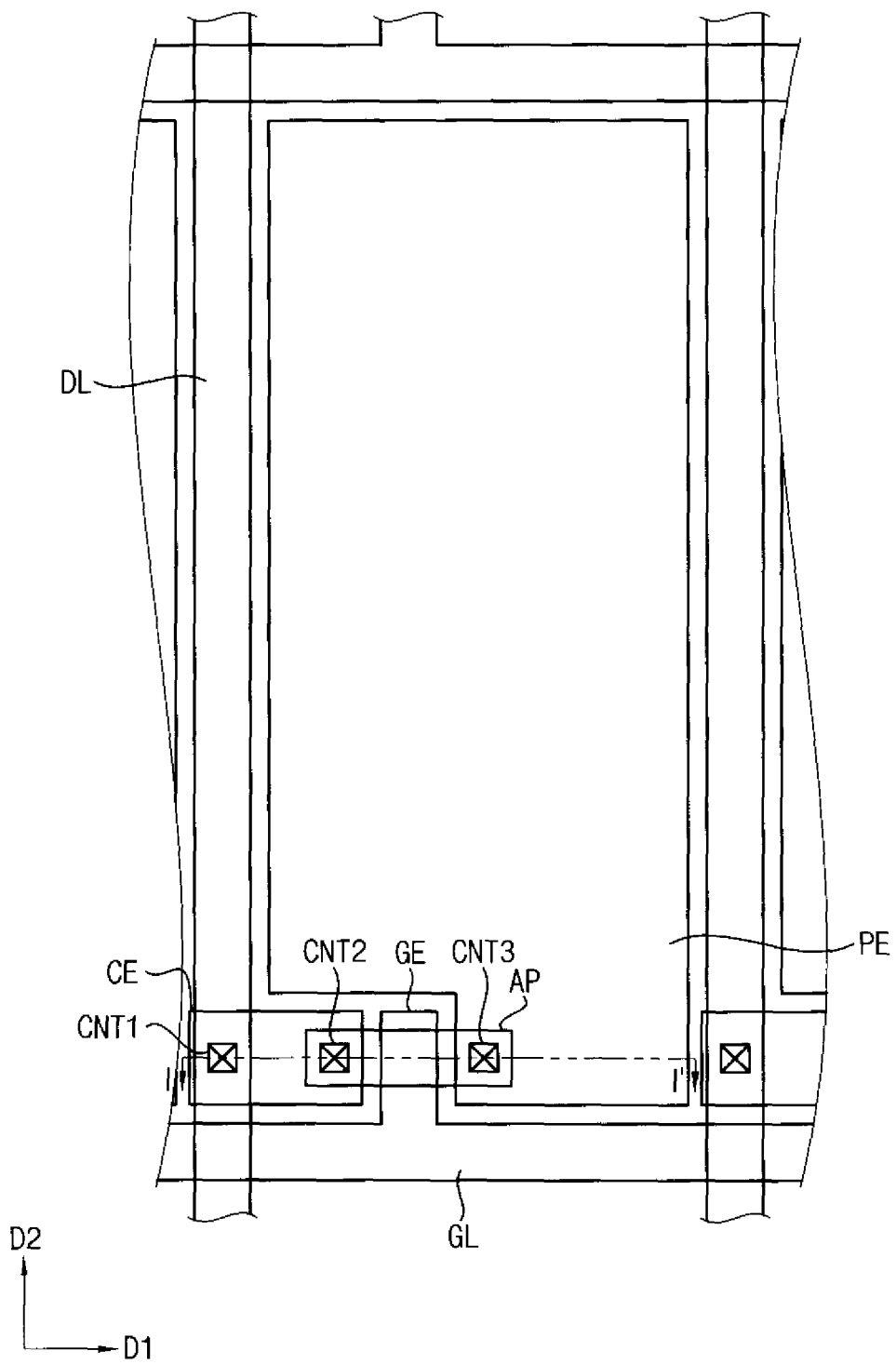
FIG. 1 is a plan view of an exemplary embodiment of a thin film transistor ("TFT") substrate according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" or "lower" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Figure 2:
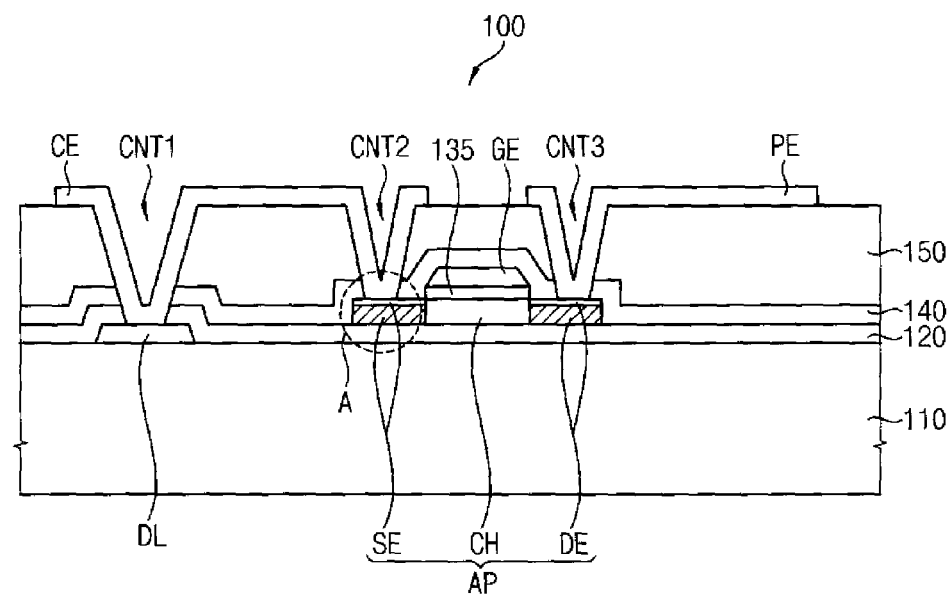
FIG. 2 is a cross-sectional view taken along line I-I' of FIG. 1.
Figure 3:
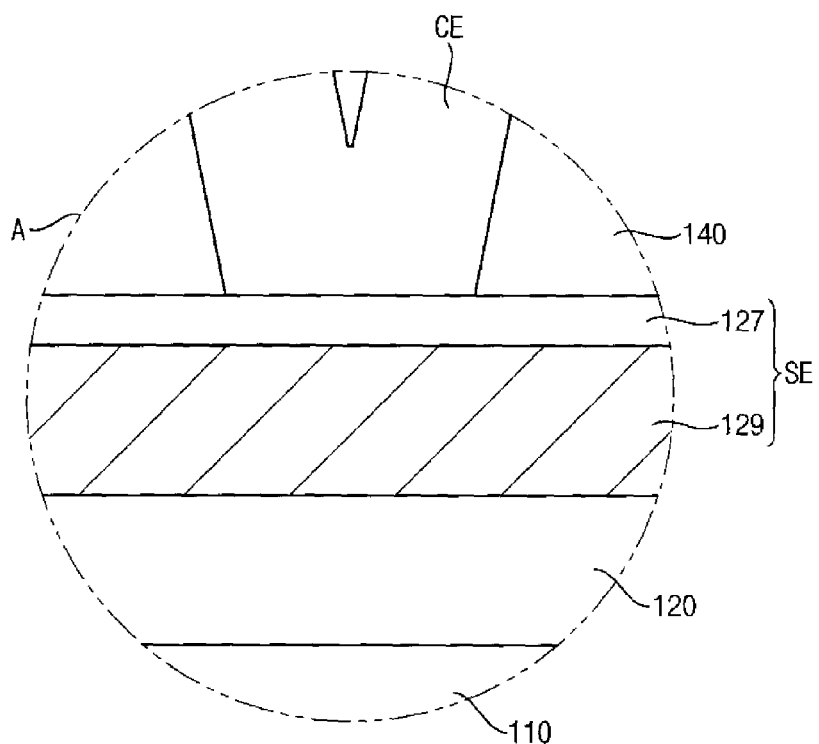
FIG. 3 is an enlarged cross-sectional view of portion 'A' of FIG. 2.

FIG. 1 is a plan view of an exemplary embodiment of a thin film transistor ("TFT") substrate according to the invention. FIG. 2 is a cross-sectional view taken along line I-I' of FIG. 1. FIG. 3 is an enlarged cross-sectional view of portion 'A' of FIG. 2.

Referring to FIGS. 1 and 2, an exemplary embodiment of a TFT substrate 100 according to the invention includes a base substrate 110, a data line DL, a gate line GL, a gate electrode GE, a pixel electrode PE, a connection electrode CE and an active pattern AP. The TFT substrate 100 may include a plurality of data lines DL, gate lines GL, gate electrodes GE, pixel electrodes PE, connection electrodes CE and/or active patterns AP.

The base substrate 110 includes a transparent material, for example, glass or plastic material.

The gate line GL is on the base substrate 110, and has a longitudinal axis which extends in a first direction D1. The data line DL has a longitudinal axis which extends in a second direction D2 crossing the first direction D1. A data insulation layer 120 is disposed between the data line DL and the active pattern AP.

The active pattern AP includes a source electrode SE, a drain electrode DE and a channel CH. The source electrode SE, the drain electrode DE and the channel CH of the active pattern AP are disposed in a single and/or same layer of the TFT substrate 100. The active pattern AP includes amorphous indium-gallium-zinc oxide ("a-IZGO"), but is not limited thereto or thereby. The channel CH of the active pattern AP overlaps a gate insulation pattern 135 and the gate electrode GE. The active pattern AP further includes a fluorine deposition layer 127, a hydrogen doped layer or both a fluorine deposition layer 127 and a hydrogen doped layer, which will be further explained in detail referring to FIG. 3.

The gate electrode GE is continuous with and electrically connected to the gate line GL. In one exemplary embodiment, for example, the gate electrode GE may include or be formed of substantially a same metal layer as the gate line GL, and may be extended from the gate line GL to form a single, unitary, indivisible member.

The illustrated exemplary embodiment of the TFT substrate 100 includes a top-gate structure, in which the gate electrode GE is disposed on the active pattern AP. Accordingly, in an exemplary embodiment of forming the TFT substrate 100, the gate electrode GE disposed on the active pattern AP may be used as a mask when treating the active pattern AP by plasma.

While not shown, a buffer pattern may be disposed between the data insulation layer 120 and the active pattern AP of the TFT substrate 100. The buffer pattern may substantially be about 200 nanometers in thickness taken perpendicular to the base substrate 110. The buffer pattern may include an insulation material such as silicon oxide. Alternatively, the data insulation layer 120 may function as a buffer pattern without an additional buffer pattern between the data insulation layer 120 and the active pattern AP of the TFT substrate 100.

The connection electrode CE electrically connects the data line DL and the source electrode SE to each other. The connection electrode CE contacts the data line DL through a first contact hole CNT1 penetrating an organic insulation layer 150, a passivation layer 140 and the data insulation layer 120. Also, the connection electrode CE contacts the source electrode SE through a second contact hole CNT2 penetrating the organic insulation layer 150 and the passivation layer 140.

The pixel electrode PE is electrically connected to the drain electrode DE. The pixel electrode PE contacts the drain electrode DE through a third contact hole CNT3 penetrating the organic insulation layer 150 and the passivation layer 140.

The source electrode SE and the drain electrode DE may have substantially the same structure. Referring to FIG. 3, the source electrode SE and the drain electrode DE each include a fluorine deposition layer 127, respectively. The active pattern AP may be about 50 nanometers in total thickness, and the fluorine deposition layer 127 may be about 1 nanometer to about 10 nanometers in thickness. The a-IGZO in the active pattern AP is a semiconductor material. However, in an exemplary embodiment of forming the TFT substrate 100, the active pattern AP may have a conductive characteristic as including a conductive material when the fluorine deposition layer 127 is formed such as by plasma treatment. Various plasmas such as fluorine plasma, hydrogen plasma, and helium plasma may be used in the plasma treatment to form the fluorine deposition layer 127. In one exemplary embodiment, for example, sulfur hexafluoride ("SF6") plasma, hydrogen plasma (H2) plasma, helium (He) plasma, a mixture of nitrogen trifluoride (NF3) and oxygen (O2) plasma, and/or a mixture of tetrafluoromethane ("CF4") and argon (Ar) plasma may be used in the plasma treatment.

Additionally or alternatively, the source electrode SE and the drain electrode DE include a hydrogen doped layer 129, respectively, when the a-IGZO is doped with hydrogen. The hydrogen doped layer 129 is conductive. Thus, when the active pattern AP is treated by the hydrogen plasma, a portion of the active pattern AP exposed by the hydrogen plasma includes a hydrogen doped layer 129 which is different from the fluorine deposition layer 127 in a thickness direction. The fluorine deposition layer 127 may be disposed closer to upper surfaces of the source electrode SE and the drain electrode DE than the hydrogen doped layer 129.

When a portion of the active pattern AP including the a-IGZO includes the fluorine deposition layer 127, the hydrogen doped layer 129, or both the fluorine deposition layer 127 and the hydrogen doped layer 129, the fluorine deposition layer 127 and/or the hydrogen doped layer 129 may be used as a conductive signal electrode. A conductive signal electrode of the TFT substrate 100 includes the source electrode SE or the drain electrode DE, but is not limited thereto or thereby.

Also, another portion of the active pattern AP excluding the fluorine deposition layer 127 and/or the hydrogen doped layer 129 is used as the channel CH for the source electrode SE and the drain electrode DE.

The exemplary embodiment of the TFT substrate 100 according to the invention may include active pattern AP having the fluorine deposition layer 127 or the hydrogen doped layer 129 to reduce specific resistance within the TFT substrate 100 by increasing an electron carrier concentration of signal electrodes of the active pattern AP. In particular, the effect of reducing the specific resistance of the TFT substrate 100 according to the illustrated exemplary embodiment is further explained in detail referring to Table 1 below.

Table 1 shows exemplary results illustrating electron carrier concentration and specific resistance of an a-IGZO layer, when the a-IGZO layer is not treated by plasma, when the a-IGZO layer is treated by SF6 plasma, when the a-IGZO layer is treated by a mixture of NF3 plasma and O2 plasma, when the a-IGZO layer is treated by H2 plasma, and when the a-IGZO layer is treated by a mixture of CF4 plasma and Ar plasma, respectively. As shown in Table 1, when the a-IGZO layer is treated by the above plasmas, electron carrier concentration per square centimeter ($cm^{-2}$) increases and a specific resistance per unit area (e.g., square) decreases in comparison to that of the a-IGZO layer without plasma treatment, respectively. Before the a-IGZO layer is treated by plasmas in Table 1, the insulation layer 150 is etched by NF3 gas.

TABLE 1

| Plasma treatment | Without plasma treatment | SF6 Plasma | Mixture of NF3 and O2 plasmas | H2 Plasma | Mixture of CF4 and Ar plasmas |
|---|---|---|---|---|---|
| Electron carrier concentration ($\times 10^{19}\,cm^{-2}$) | 6.01 | 7.35 | 7.65 | 7.50 | 7.19 |
| Specific resistance ($\Omega$/square) | 817.2 | 655.7 | 653.3 | 662.9 | 661.2 |

As the active pattern AP includes the fluorine deposition layer 127 formed by the above plasmas, a portion of the active pattern AP treated by the plasmas has lower specific resistance. When the active pattern AP is treated by plasma other than fluorine plasma, the active pattern AP may have a fluorine deposition layer since some of the NF3 gas used in the etching the insulation layer 150 remains on a surface of the a-IGZO layer. Hereinafter, fluoride component detected in the a-IGZO layer according to the plasma treatment is explained referring to FIGS. 4A to 4D.

Figure 4A:
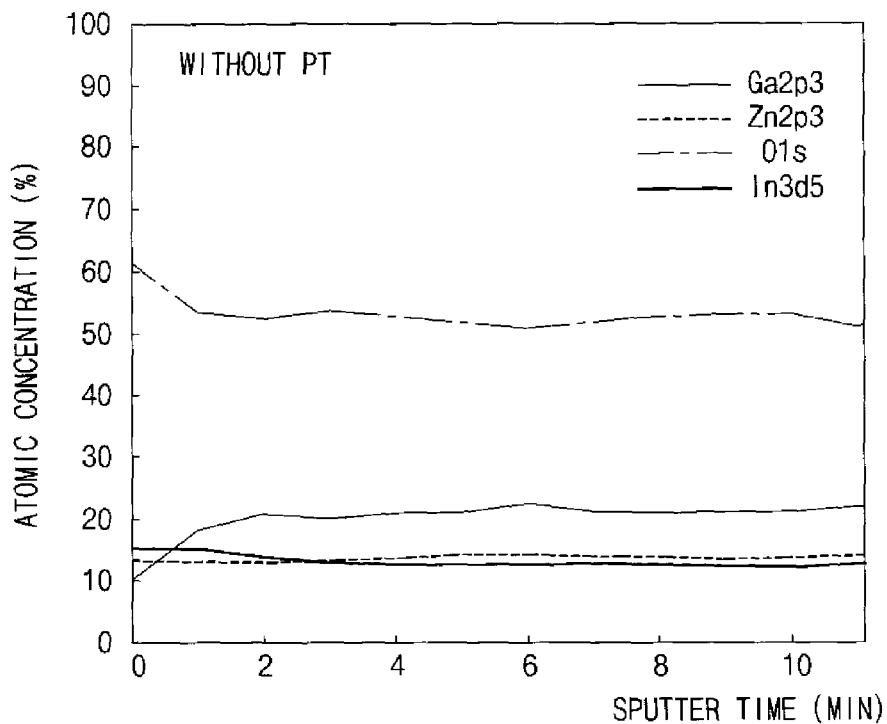
FIGS. 4A to 4D are graphs illustrating exemplary embodiments of atomic concentrations in percent (%) detected on a surface of an amorphous indium-gallium-zinc oxide ("a-IGZO") layer with respect to a sputter time in minutes (min) according to the invention.
Figure 4B:
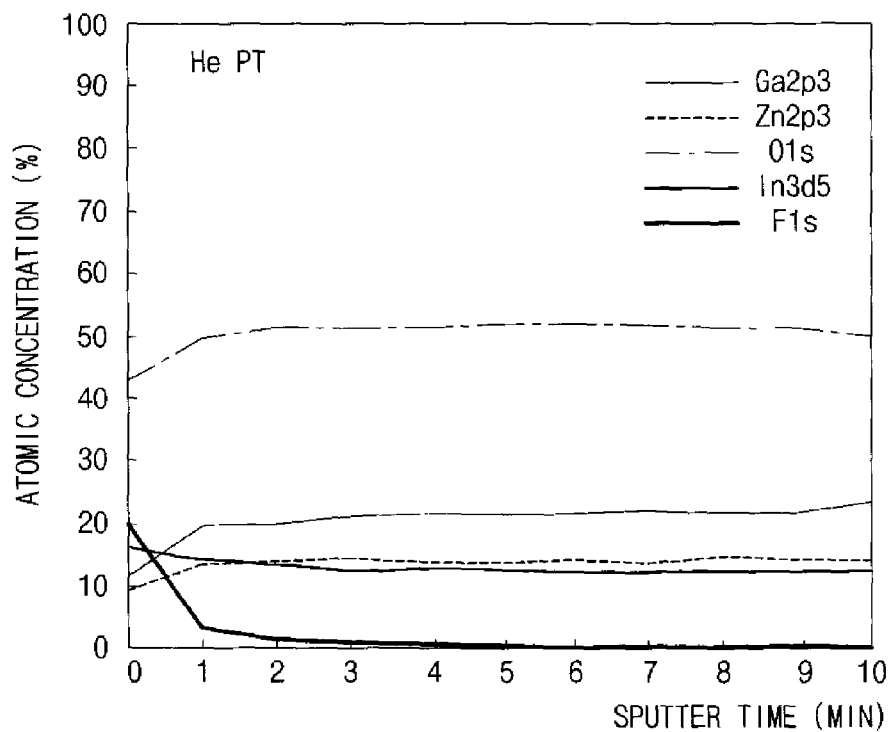
Figure 4C:
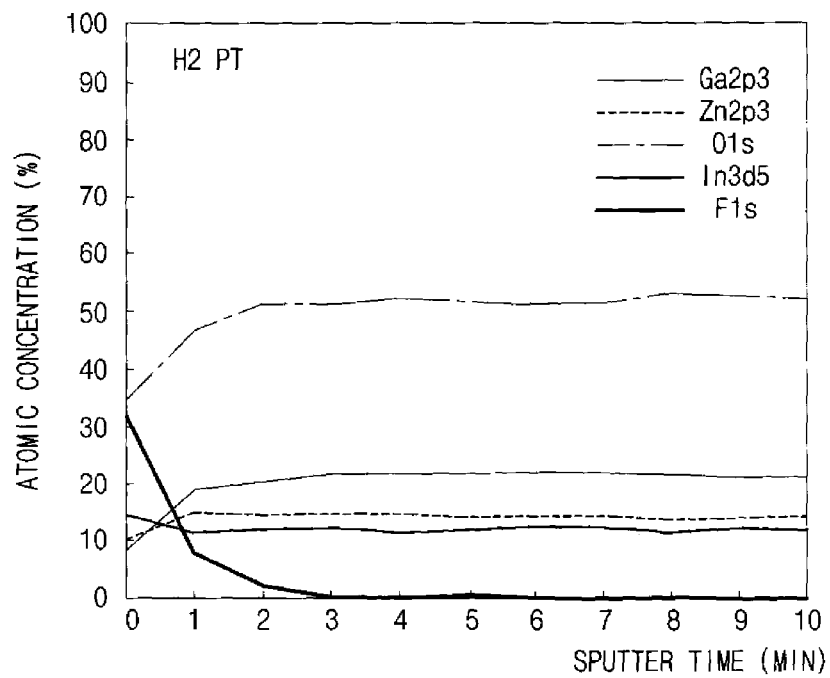
Figure 4D:
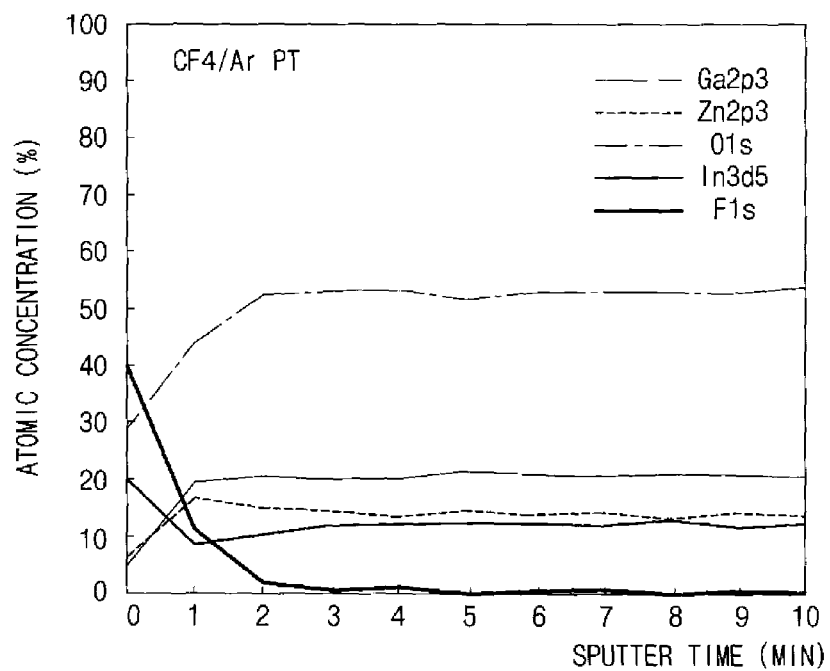

FIGS. 4A to 4D are graphs illustrating exemplary embodiments of atomic concentrations in percent (%) detected on a surface of a-IGZO layer with respect to sputtering time in minutes (min) according to the invention. More specifically, FIG. 4A is a graph illustrating an atomic concentration according to sputtering time when the a-IGZO layer is not treated by plasma ("WITHOUT PT"). FIG. 4B is a graph illustrating an atomic concentration according to sputtering time when the a-IGZO layer is treated by He plasma ("He PT"). FIG. 4C is a graph illustrating an atomic concentration according to sputtering time when the a-IGZO layer is treated by H2 plasma ("H2 PT"). FIG. 4D is a graph illustrating an atomic concentration according to sputtering time when the a-IGZO layer is treated by a mixture of CF4 plasma and Ar plasma ("CF4/Ar PT"). In FIG. 4A to 4D, the sputter rate was processed in about 1.5 nanometers per minute.

Referring to FIG. 4A, when the a-IGZO layer is not treated by plasma, a portion within about 3 nanometers thickness from the surface of the a-IGZO layer (i.e., within about 1 minute of sputtering time) includes an oxygen component ("O1s") of more than 50%, but does not significantly include a fluoride component. On the other hand, referring to FIGS. 4B to 4D, when the a-IGZO layer is treated by He plasma, H2 plasma, and a mixture of CF4 plasma and Ar plasma, respectively, a portion within about 3 nanometer thickness from the surface of the a-IGZO layer includes a fluoride component ("F1s") of more than 20%. Also, the oxygen component decreases to about 40% or less when the thickness portion of the a-IGZO includes the fluoride component. Accordingly, as the surface of the a-IGZO layer is treated by fluorine plasma, hydrogen plasma or helium plasma, a conductive signal electrode converted from the a-IGZO material may increase the electron carrier concentration and reduce the specific resistance.

When the a-IGZO layer is treated by above plasmas, the active pattern AP may include a hydrogen doped layer 129. The hydrogen doped layer 129 may be formed deeper than the fluorine deposition layer 127 with respect to an upper surface of the active pattern AP.

In one exemplary embodiment, the active pattern AP may be subsequently treated by helium plasma after the active pattern AP is treated by a first plasma such as fluorine plasma, hydrogen plasma or helium plasma. When the active pattern AP is subsequently treated by helium plasma, uniformity of the specific resistance of the conductive signal electrode may increase.

FIGS. 5A to 5I are cross-sectional views illustrating an exemplary embodiment of a method of manufacturing the TFT substrate of FIGS. 2 and 3.

Figure 5A:
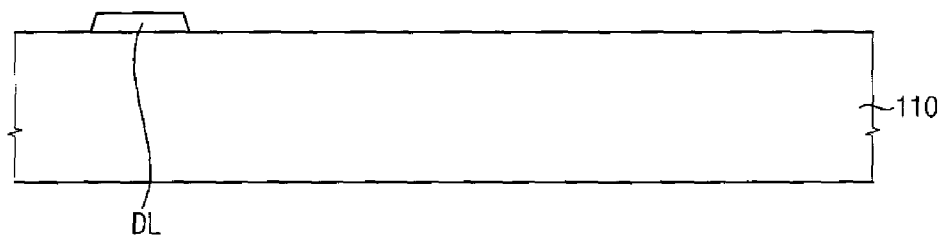
FIGS. 5A to 5I are cross-sectional views illustrating an exemplary embodiment of a method of manufacturing the TFT substrate of FIGS. 2 and 3.

Referring to FIG. 5A, a data line DL extending in the second direction D2 is formed (e.g., provided) on a base substrate 110. The data line DL may be formed from and/or include a data metal layer. In one exemplary embodiment, the data metal layer is formed on the base substrate 110. A photoresist PR (not shown) is formed at a position corresponding to the data line DL, on the data metal layer. The data metal layer may be patterned using the photoresist PR as a mask to form the data line DL.

Figure 5B:
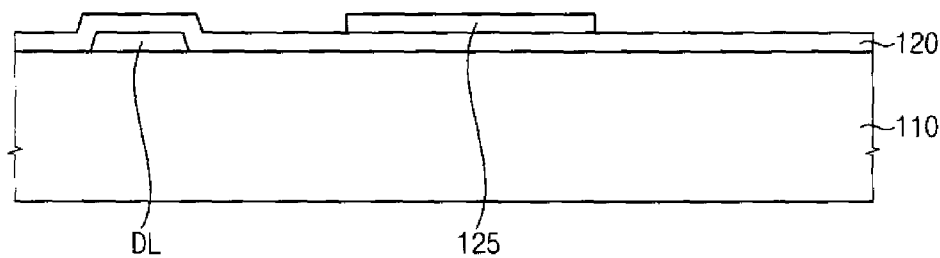

Referring to FIG. 5B, a data insulation layer 120 is formed on the base substrate 110 including the data line DL. The data insulation layer 120 may include silicon oxide or silicon nitride. A semiconductor pattern 125 is formed on the base substrate 110 including the data insulation layer 120. In one exemplary embodiment, a semiconductor layer is formed on the base substrate 110 including the data insulation layer 120. The semiconductor layer may be patterned to form the semiconductor pattern 125. The semiconductor pattern 125 includes a-IGZO. According to an exemplary embodiment, a buffer pattern (not shown) may be formed on the data insulation layer 120, and the semiconductor pattern 125 may be formed on the buffer pattern.

Figure 5C:
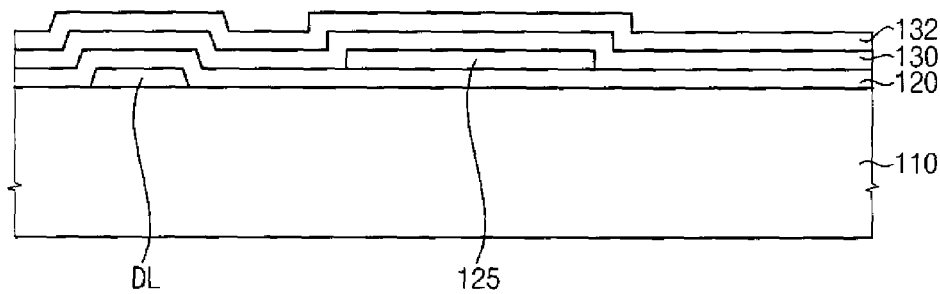

Referring to FIG. 5C, a gate insulation layer 130 and a gate metal layer 132 are sequentially formed on the base substrate 110 including the semiconductor pattern 125. The gate insulation layer 130 covers the semiconductor pattern 125. The gate insulation layer 130 may include silicon oxide or silicon nitride. The gate metal layer 132 is formed on the gate insulation layer 130. The gate metal layer 132 may include copper, silver, chromium, molybdenum, aluminum, titanium or an alloy thereof. The gate metal layer 132 may have a single layer structure including a single material, or may include a multi-layer structure including a plurality of materials. In one exemplary embodiment, for example, the gate metal layer 132 may have multi-layer structure in which a molybdenum layer and an aluminum layer are stacked.

Figure 5D:
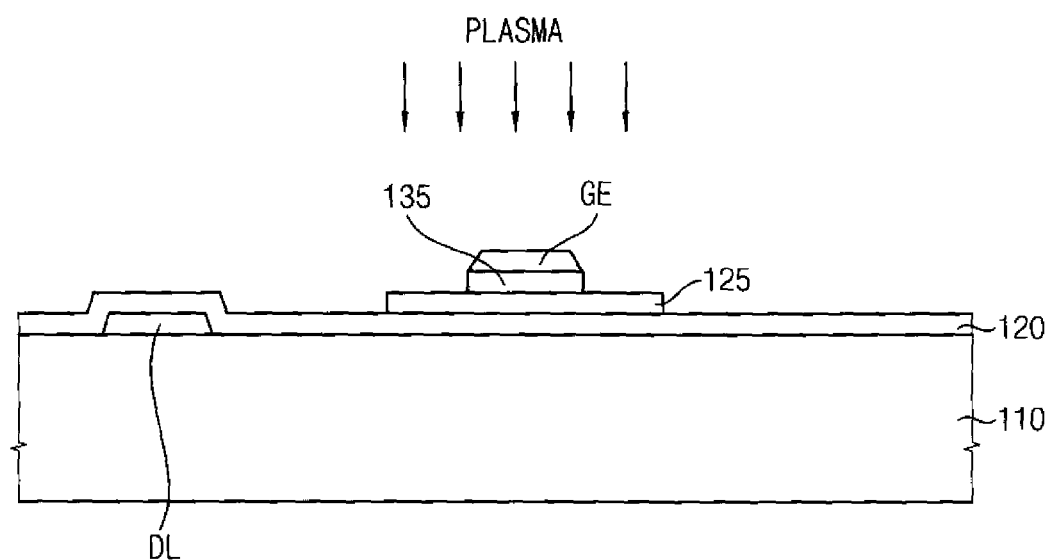

Referring to FIG. 5D, the gate insulation layer 130 and the gate metal layer 132 are patterned to form a gate insulation pattern 135 and a gate electrode GE, respectively. In one exemplary embodiment, a photoresist PR is formed at a position corresponding to the gate electrode GE, on the gate metal layer 132. The gate metal layer 132 may be patterned to form the gate electrode GE. In forming the gate insulation pattern 135, NF3 gas may be used as an etching gas for patterning the gate insulation layer 130, but is not limited thereto or thereby.

The gate insulation pattern 135 and the gate electrode GE overlap with a portion of the semiconductor pattern 125. More specifically, the gate insulation pattern 135 and the gate electrode GE may overlap a center portion of the semiconductor pattern 125. A portion of the semiconductor pattern 125 is covered by the gate insulation pattern 135 and the gate electrode GE. Another portion (e.g., a remaining portion) of the semiconductor pattern 125 is exposed on the base substrate 110.

Figure 5E:
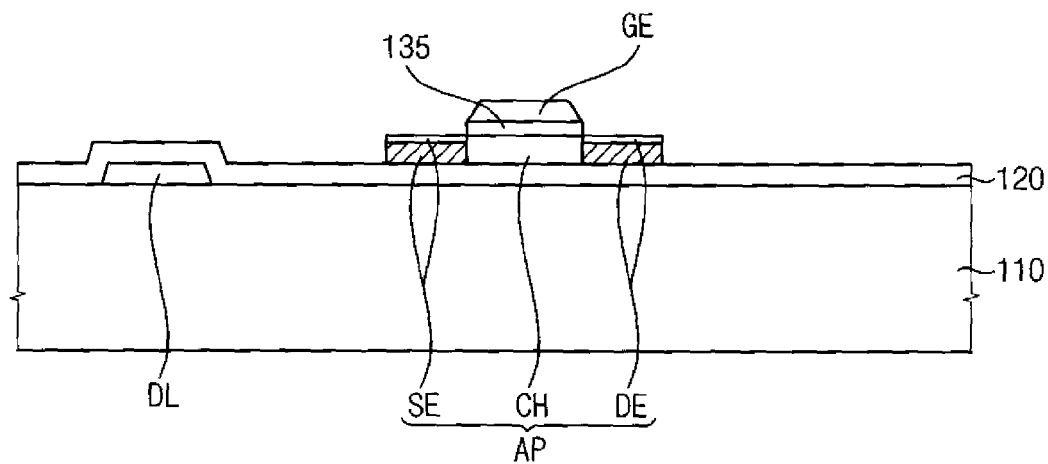

Referring to FIGS. 5D and 5E, the base substrate 110 including the gate electrode GE is treated by a first plasma to form a fluorine deposition layer or a hydrogen doped layer on an exposed portion of the semiconductor pattern 125. The first plasma includes fluorine plasma, hydrogen plasma, helium plasma or a mixture of other plasma components. In one exemplary embodiment, for example, the first plasma may include SF6 plasma, H2 plasma, He plasma, a mixture of NF3 and oxygen plasmas, or a mixture of CF4 and Ar plasmas.

When NF3 gas is used as an etching gas for patterning the gate insulation layer 130 to form the gate insulation pattern 135, a fluoride component from the etching gas may remain on a surface of the semiconductor pattern 125 exposed by the gate insulation pattern 135. When the fluoride component remains on the surface of the exposed semiconductor pattern 125, both a fluorine deposition layer and a hydrogen doped layer may be formed on the exposed portion of the semiconductor pattern 125 when treating the exposed portion by the first plasma including the hydrogen plasma.

A portion of the semiconductor pattern 125 including the fluorine deposition layer and/or the hydrogen doped layer is used as the source electrode SE and the drain electrode DE. Another portion of the semiconductor pattern except for the source electrode SE and the drain electrode DE, is used as a channel CH. The channel CH overlaps the gate electrode GE and the gate insulation pattern 135. The channel CH is formed in a same layer as and between the source electrode SE and the drain electrode DE. Accordingly, when the semiconductor pattern 125 is treated by a first plasma, an active pattern AP is formed from the semiconductor pattern 125, and includes the source electrode SE, the drain electrode DE and the channel CH.

According to an exemplary embodiment of forming the TFT substrate 100, the base substrate 110 including the active pattern AP may be treated by a second plasma, but is not limited thereto or thereby. The second plasma may include helium plasma, but is not limited thereto or thereby. By treating the active pattern AP by the second plasma, uniformity of the specific resistance of the source electrode SE and the drain electrode DE may be improved.

Figure 5F:
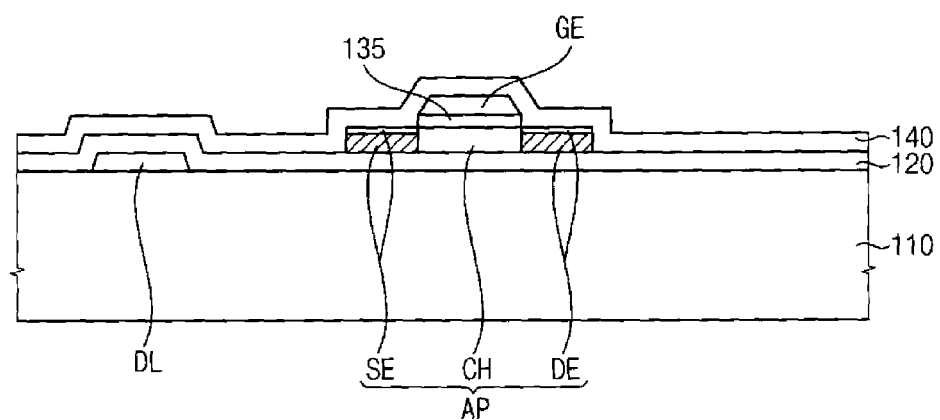

Referring to FIG. 5F, a passivation layer 140 is formed on the base substrate 110 including the active pattern AP. The passivation layer 140 covers the gate electrode GE and the active pattern AP entirely. The passivation layer 140 may include silicon oxide or silicon nitride. The passivation layer 140 may be about 100 nanometers in thickness.

Figure 5G:
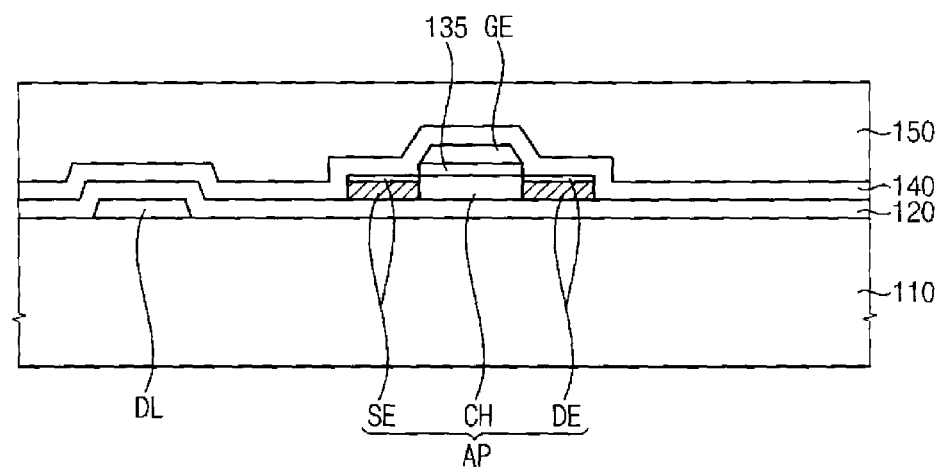

Referring to FIG. 5G, an organic insulation layer 150 is formed on the base substrate 110 including the passivation layer 140. The organic insulation layer 150 flattens or planarizes the base substrate 110 including the passivation layer 140.

Figure 5H:
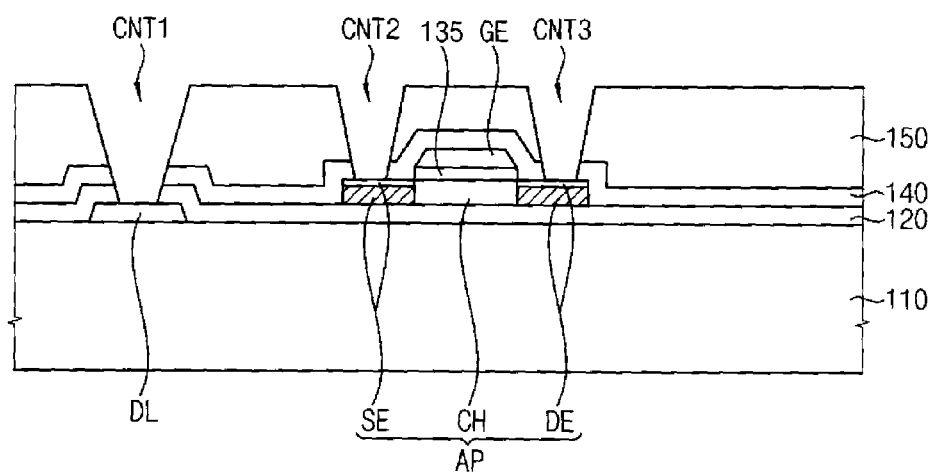

Referring to FIG. 5H, a first contact hole CNT1, a second contact hole CNT2 and a third contact hole CNT3 are formed on the base substrate 110 including the organic insulation layer 150. The first contact hole CNT1 is formed penetrating the organic insulation layer 150, the passivation layer 140 and the data insulation layer 120 corresponding to a position of the data line DL. The first contact hole CNT1 partially exposes the data line DL. The second contact hole CNT2 is formed penetrating the organic insulation layer 150 and the passivation layer 140 corresponding to a position of the source electrode SE. The second contact hole CNT2 partially exposes the source electrode SE. The exposed portion of the source electrode SE may include the fluorine deposition layer. The third contact hole CNT3 is formed penetrating the organic insulation layer 150 and the passivation layer 140 corresponding to a position of the drain electrode DE. The third contact hole CNT3 partially exposes the drain electrode DE. The exposed portion of the drain electrode DE may include the fluorine deposition layer.

Figure 5I:
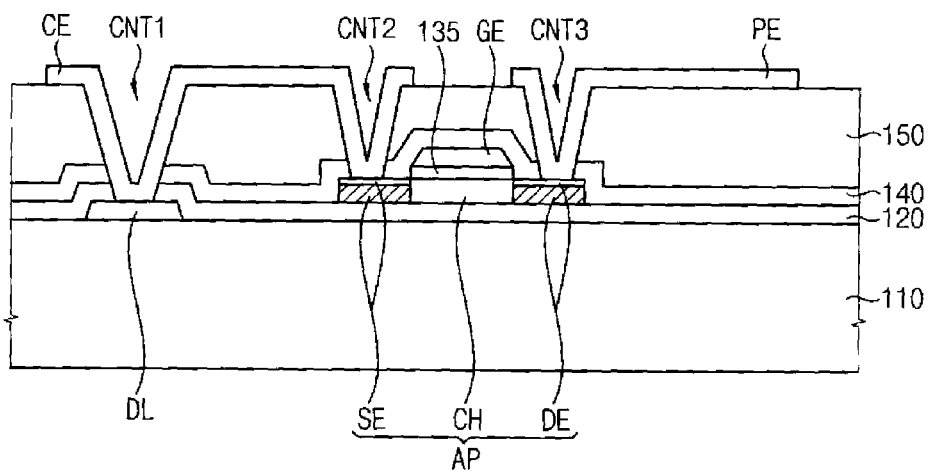

Referring to FIG. 5I, a connection electrode CE and a pixel electrode PE are formed on the base substrate 110 including the first contact hole CNT1, the second contact hole CNT2 and the third contact hole CNT3. The connection electrode CE contacts the exposed portion of the data line DL and then exposed portion of the source electrode SE through the first contact hole CNT1 and the second contact hole CNT2, respectively. The pixel electrode PE contacts the exposed portion of the drain electrode DE through the third contact hole CNT3.

Figure 6:
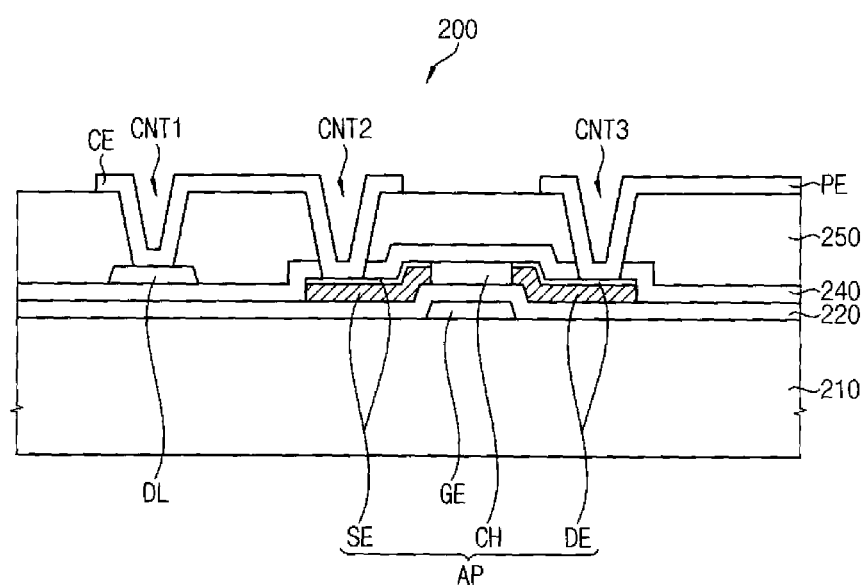
FIG. 6 is a cross-sectional view of another exemplary embodiment of a TFT substrate according to the invention.

FIG. 6 is a cross-sectional view of another exemplary embodiment of a TFT substrate according to the invention.

Referring to FIGS. 1 and 6, an exemplary embodiment of a TFT substrate 200 according to the invention includes a base substrate 210, a data line DL, a gate line GL, a gate electrode GE, a pixel electrode PE, a connection electrode CE and an active pattern AP. The TFT substrate 200 may include a plurality of data lines DL, gate lines GL, gate electrodes GE, pixel electrodes PE, connection electrodes CE and/or active patterns AP.

The base substrate 210 includes transparent material, for example, glass or plastic material.

The gate line GL is on the base substrate 210 and has a longitudinal axis which extends in a first direction D1. The data line DL has a longitudinal axis which extends in a second direction D2 crossing the first direction D1.

The gate electrode GE is continuous with and electrically connected to the gate line GL. In one exemplary embodiment, for example, the gate electrode GE may be extended from the gate line GL when the gate line GL and the gate electrode GE are in a same single metal layer. A gate insulation layer 220, which can be otherwise referred to as a gate insulation pattern, is disposed between the gate electrode GE and the active pattern AP.

The illustrated exemplary embodiment of the TFT substrate 200 has a bottom-gate structure in which the gate electrode GE is disposed under the active pattern AP, and between the base substrate 210 and the active pattern AP. Accordingly, in an exemplary embodiment of forming the TFT substrate 200 with the bottom-gate structure, an exposed portion of the active pattern AP may be treated by plasma when a photoresist PR is disposed on the active pattern and is used as a mask in forming the active pattern AP.

The active pattern AP includes a source electrode SE, a drain electrode DE and a channel CH. The source electrode SE, the drain electrode DE and the channel CH are formed from and/or in a single layer of the TFT substrate 200. The active pattern AP includes an a-IGZO layer. The channel CH of the active pattern AP overlaps the gate electrode GE. The active pattern AP may include a fluorine deposition layer, a hydrogen doped layer, or both a fluorine deposition layer and a hydrogen doped layer.

In particular, the source electrode SE and the drain electrode DE include a fluorine deposition layer, respectively. The active pattern AP may be about 50 nanometers in total thickness. Within the active pattern AP, the fluorine deposition layer may be about 1 nanometer to about 10 nanometers in thickness. The a-IGZO in the active pattern AP is a semiconductor material. However, in an exemplary embodiment of forming the TFT substrate 200, the active pattern AP may be formed to have a conductive characteristic as including a conductive material when the fluorine deposition layer is formed such as by plasma treatment. Various plasmas such as fluorine plasma, hydrogen plasma and helium plasma may be used in the plasma treatment to form the fluorine deposition layer. In one exemplary embodiment, for example, sulfur hexafluoride ("SF6") plasma, hydrogen plasma ("H2") plasma, helium ("He") plasma, a mixture of nitrogen trifluoride ("NF3") and oxygen ("O2") plasma, and a mixture of tetrafluoromethane ("CF4") and argon ("Ar") plasma may be used in the plasma treatment.

Additionally or alternatively, the source electrode SE and the drain electrode DE may include a hydrogen doped layer, respectively, when the a-IGZO is doped with hydrogen. The hydrogen doped layer is conductive. Thus, when the active pattern AP is treated by the hydrogen plasma, a portion of the active pattern AP exposed by the hydrogen plasma includes a hydrogen doped layer which is different from the fluorine deposition layer in a thickness direction. The fluorine deposition layer may be disposed closer to upper surfaces of the source electrode SE and the drain electrode DE than the hydrogen doped layer.

When a portion of the active pattern AP including the a-IGZO includes the fluorine deposition layer, the hydrogen doped layer or both the fluorine deposition layer and the hydrogen doped layer, the fluorine deposition layer and/or the hydrogen doped layer may be used as a conductive signal electrode. The conductive signal electrode includes the source electrode SE or the drain electrode DE.

Also, another portion of the active pattern AP excluding the fluorine deposition layer and/or the hydrogen doped layer is used as a channel CH for the source electrode SE and the drain electrode DE.

Although not shown, a buffer layer may be disposed between the gate insulation layer 220 and the active pattern AP of the TFT substrate 200. The buffer layer may be about 200 nanometers in thickness. The buffer layer may include an insulation material such as silicon oxide. Alternatively, the gate insulation layer 220 may function as a buffer layer without an additional buffer pattern between the gate insulation layer 220 and the active pattern AP.

The connection electrode CE electrically connects the data line DL and the source electrode SE to each other. The connection electrode CE contacts the data line DL through a first contact hole CNT1 penetrating an organic insulation layer 250. Also, the connection electrode CE contacts the source electrode SE through a second contact hole CNT2 penetrating the organic insulation layer 250 and a passivation layer 240.

The pixel electrode PE is electrically connected to the drain electrode DE. The pixel electrode PE contacts the drain electrode DE through a third contact hole CNT3 penetrating the organic insulation layer 250 and the passivation layer 240.

The source electrode SE and the drain electrode DE may have substantially the same structure. Referring again to FIG. 3, the exemplary embodiment of the TFT substrate 200 may include an active pattern AP including the fluorine deposition layer 127, the hydrogen doped layer 129 or both the fluorine deposition layer 127 and the hydrogen doped layer 129 to reduce specific resistance within the TFT substrate 200 by increasing an electron carrier concentration of signal electrodes of the active pattern AP.

FIGS. 7A to 7H are cross-sectional views illustrating an exemplary embodiment of a method of manufacturing the TFT substrate of FIG. 6.

Figure 7A:
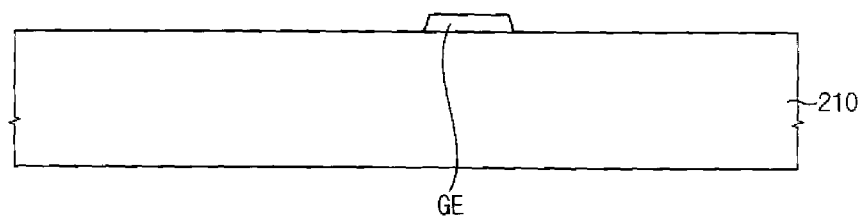
FIGS. 7A to 7H are cross-sectional views illustrating an exemplary embodiment of a method of manufacturing the TFT substrate of FIG. 6.

Referring to FIG. 7A, a gate electrode GE is formed (e.g., provided) on a base substrate 210. In one exemplary embodiment, a gate metal layer is formed on the base substrate 210. A photoresist PR (not shown) is formed at a position corresponding to the gate electrode GE, on the gate metal layer. The gate metal layer may be patterned using the photoresist PR as a mask to form the gate electrode GE.

Figure 7B:
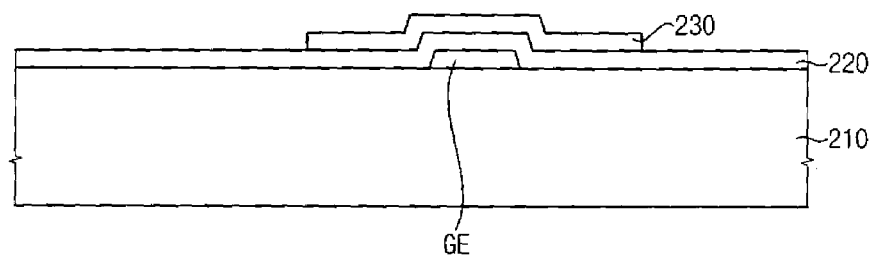

Referring to FIG. 7B, a gate insulation layer 220 is formed on the base substrate 210 including the gate electrode GE. The gate insulation layer 220 may include silicon oxide or silicon nitride. A semiconductor pattern 230 is formed on the base substrate 210 including the gate insulation layer 220. The semiconductor pattern 230 includes a-IGZO. According to an exemplary embodiment, a buffer layer (not shown) may be formed on the gate insulation layer 220, and the semiconductor pattern 230 may be formed on the buffer layer.

Figure 7C:
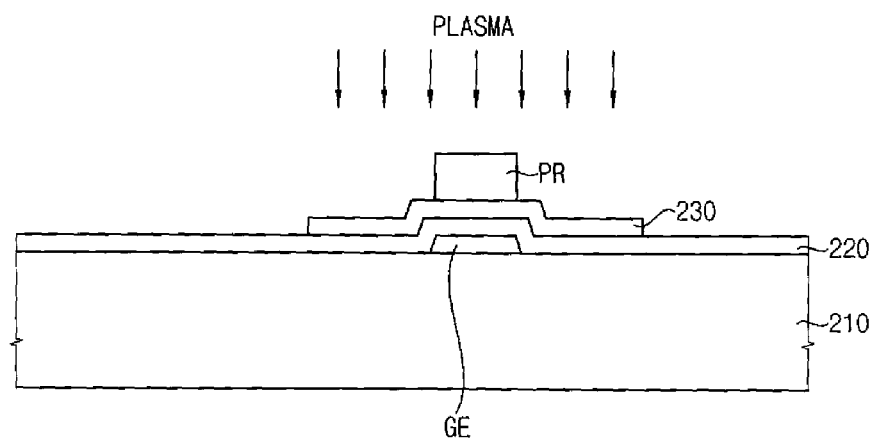

Referring to FIG. 7C, a photoresist PR is formed on the base substrate 210 including the semiconductor pattern 230. The photoresist pattern partially overlaps the semiconductor pattern 230. In particular, the photoresist PR may overlap with a center portion of the semiconductor pattern 230. Accordingly, a portion of the semiconductor pattern 230 is covered by the photoresist PR, and another portion (e.g., a remaining portion) of the semiconductor pattern 230 is exposed on the base substrate 210.

Figure 7D:
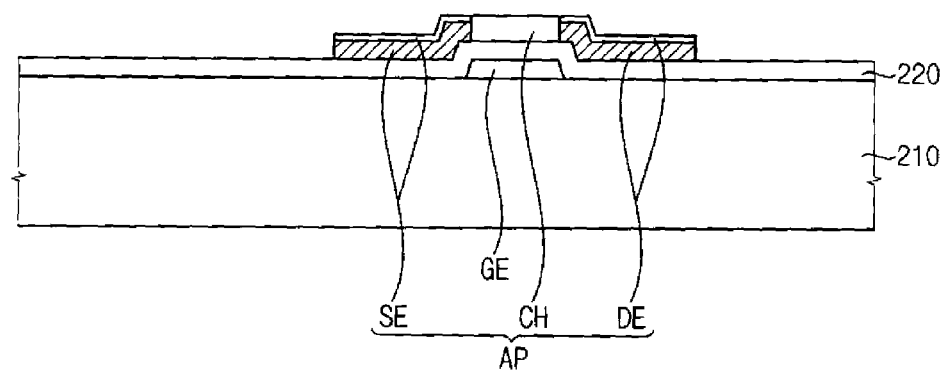

Referring to FIGS. 7C and 7D, the base substrate 210 including the gate electrode GE is treated by a first plasma to form a fluorine deposition layer or a hydrogen doped layer on an exposed portion of the semiconductor pattern 230. The first plasma includes fluorine plasma, hydrogen plasma, helium plasma or a mixture of other plasma components. In one exemplary embodiment, for example, the first plasma may include SF6 plasma, H2 plasma, He plasma, a mixture of NF3 and oxygen plasmas, or a mixture of CF4 and Ar plasmas.

A portion of the semiconductor pattern 230 including the fluorine deposition layer and/or the hydrogen doped layer is used as the source electrode SE and the drain electrode DE. Another portion of the semiconductor pattern except for the source electrode SE and the drain electrode DE, is used as a channel CH. The channel CH overlaps the gate electrode GE. The channel CH is formed in a same layer as and between the source electrode SE and the drain electrode DE. Accordingly, when the semiconductor pattern 230 is treated by a first plasma, an active pattern AP is formed from the semiconductor pattern 230, and includes the source electrode SE, the drain electrode DE and the channel CH.

According to an exemplary embodiment of forming the TFT substrate 200, the base substrate 210 including the active pattern AP may be treated by a second plasma, but is not limited thereto or thereby. The second plasma may include helium plasma, but is not limited thereto or thereby. By treating the active pattern AP by the second plasma, uniformity of the specific resistance of the source electrode SE and the drain electrode DE may be improved.

Figure 7E:
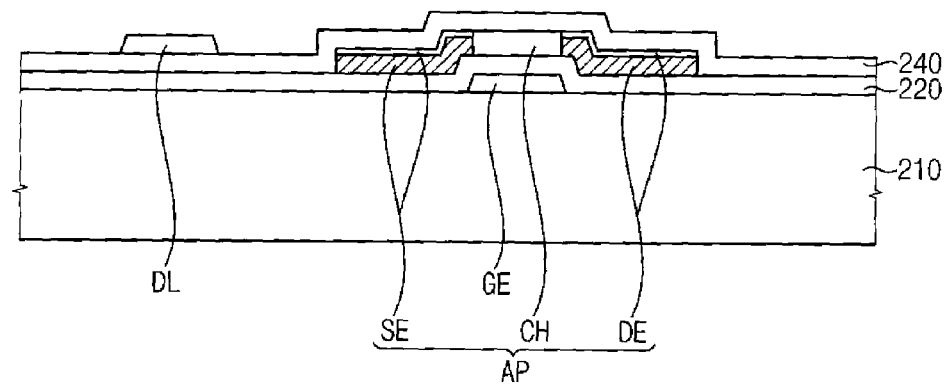

Referring to FIG. 7E, a passivation layer 240 is formed on the base substrate 210 including the active pattern AP. The passivation layer 240 covers the active pattern AP entirely. The passivation layer 240 may include silicon oxide or silicon nitride. The passivation layer 240 may be about 100 nanometers in thickness.

A data line DL extended to the second direction D2 is formed on the base substrate 210 including the passivation layer 240. In one exemplary embodiment, a data metal layer may be patterned to form the data line DL. The data metal layer may include copper, silver, chromium, molybdenum, aluminum, titanium, or an alloy thereof.

Figure 7F:
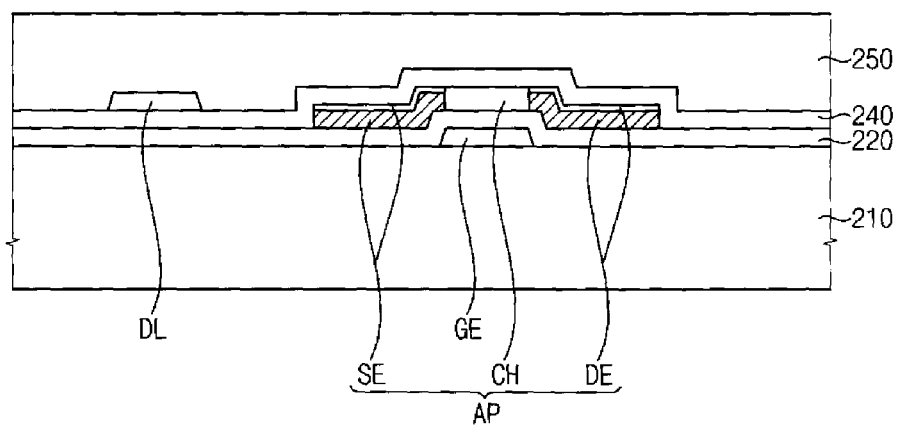

Referring to FIG. 7F, an organic insulation layer 250 is formed on the base substrate 210 including the data line DL. The organic insulation layer 250 flattens or planarizes the base substrate 210 including the data line DL.

Figure 7G:
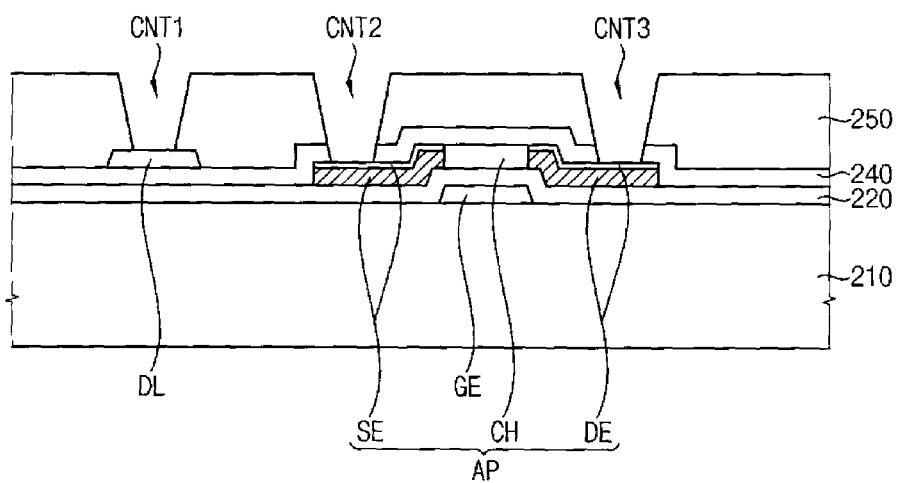

Referring to FIG. 7G, a first contact hole CNT1, a second contact hole CNT2 and a third contact hole CNT3 are formed on the base substrate 210 including the organic insulation layer 250. The first contact hole CNT1 is formed penetrating the organic insulation layer 250 corresponding to a position of the data line DL. The first contact hole CNT1 partially exposes the data line DL. The second contact hole CNT2 is formed penetrating the organic insulation layer 250 and the passivation layer 240 corresponding to a position of the source electrode SE. The second contact hole CNT2 partially exposes the source electrode SE. The exposed portion of the source electrode SE may include the fluorine deposition layer. The third contact hole CNT3 is formed penetrating the organic insulation layer 250 and the passivation layer 240 corresponding to a position of the drain electrode DE. The third contact hole CNT3 partially exposes the drain electrode DE. The exposed portion of the drain electrode DE may include the fluorine deposition layer.

Figure 7H:
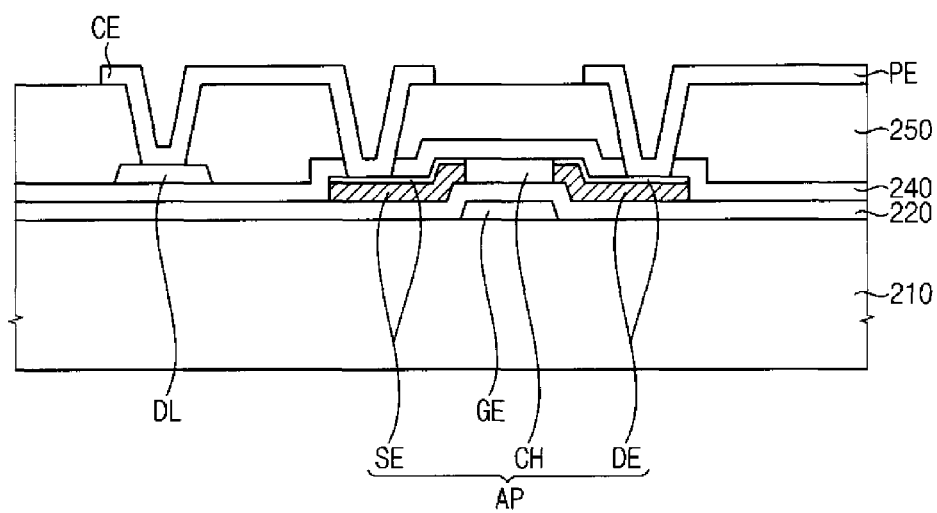

Referring to FIG. 7H, a connection electrode CE and a pixel electrode PE are formed on the base substrate 210 including the first contact hole CNT1, the second contact hole CNT2 and the third contact hole CNT3. The connection electrode CE contacts the exposed portion of the data line DL and the exposed portion of the source electrode SE through the first contact hole CNT1 and the second contact hole CNT2, respectively. The pixel electrode PE contacts the exposed portion of the drain electrode DE through the third contact hole CNT3.

According to one or more exemplary embodiments of the invention, a signal electrode of a TFT substrate of a display device may include a fluorine deposition layer, a hydrogen doped layer or both a fluorine deposition layer and a hydrogen doped layer formed by a first plasma treatment of an amorphous semiconductor using fluorine plasma, hydrogen plasma or helium plasma. The plasma treatment reduces a specific resistance by increasing an electron carrier concentration. Also, uniformity of the specific resistance of a conductive signal electrode converted from the amorphous semiconductor layer may be increased by helium plasma treating a portion of the amorphous semiconductor treated by the first plasma.

What is claimed is:

1. A thin film transistor substrate comprising:
    a base substrate;
    an active pattern on the base substrate, and comprising:
        a source electrode, a drain electrode, and a channel disposed between the source electrode and the drain electrode, each comprising a semiconductor material,
        wherein the source electrode and the drain electrode further comprise a fluorine deposition layer;
    a gate insulation pattern overlapping the channel; and
    a gate electrode overlapping the channel, wherein the gate insulation pattern is between the channel and the gate electrode.

2. The thin film transistor substrate of claim 1, wherein the channel comprises amorphous indium-gallium-zinc oxide.

3. The thin film transistor substrate of claim 1, wherein the source electrode, the drain electrode and the channel are in a same single layer of the thin film transistor substrate.

4. The thin film transistor substrate of claim 1, wherein the gate insulation pattern is between the base substrate and the gate electrode.

5. The thin film transistor substrate of claim 1, wherein the gate electrode is between the base substrate and the gate insulation pattern.

6. The thin film transistor substrate of claim 1, wherein a thickness of the fluorine deposition layer is between about 1 nanometer and about 10 nanometers.

7. The thin film transistor substrate of claim 3, wherein the fluorine deposition layer of the source electrode and the drain electrode comprises fluorine plasma-treated semiconductor material.

8. The thin film transistor substrate of claim 7, wherein
    the active pattern has a uniform specific resistance, and
    the source electrode and the drain electrode of the active pattern further comprise helium plasma-treated semiconductor material.

9. The thin film transistor substrate of claim 1, wherein the source electrode and the drain electrode further comprise a hydrogen doped layer.

10. The thin film transistor substrate of claim 9, wherein the fluorine deposition layer is closer to upper surfaces of the source electrode and the drain electrode than the hydrogen doped layer.

* * * * *